United States Patent
Kajiwara et al.

(10) Patent No.: US 12,087,823 B2
(45) Date of Patent: Sep. 10, 2024

(54) SEMICONDUCTOR DEVICE (71) Applicant: KABUSHIKI KAISHA TOSHIBA, Tokyo (JP)

(72) Inventors: Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 416 days.

(21) Appl. No.: 17/646,799

(22) Filed: Jan. 3, 2022

(65) Prior Publication Data
US 2023/0025093 A1 Jan. 26, 2023

(30) Foreign Application Priority Data
Jul. 26, 2021 (JP) ................. 2021-121276

(51) Int. Cl.
H01L 29/20 (2006.01)
H01L 29/06 (2006.01)
H01L 29/417 (2006.01)
H01L 29/778 (2006.01)

(52) U.S. Cl.
CPC ...... H01L 29/2003 (2013.01); H01L 29/0607 (2013.01); H01L 29/2006 (2013.01); H01L 29/41775 (2013.01); H01L 29/7786 (2013.01)

(58) Field of Classification Search
CPC ............. H01L 29/2003; H01L 29/0607; H01L 29/2006; H01L 29/41775; H01L 29/7786
USPC ........................................................ 257/258
See application file for complete search history.

(56) References Cited

U.S. PATENT DOCUMENTS

| | | | | |
|---|---|---|---|---|
| 2009/0008676 A1* | 1/2009 | Sato | .................. | H01L 29/42316 257/E21.403 |
| 2010/0109015 A1* | 5/2010 | Ueno | .................. | H01L 29/0649 257/E29.089 |
| 2013/0337619 A1* | 12/2013 | Zhu | ........................ | H02M 3/335 330/277 |
| 2016/0300941 A1* | 10/2016 | Cheng | ................. | H01L 29/1037 |

(Continued)

FOREIGN PATENT DOCUMENTS

| | | |
|---|---|---|
| JP | 2005-244072 A | 9/2005 |
| JP | 2008-4720 A | 1/2008 |
| JP | 2008-187173 A | 8/2008 |

(Continued)

*Primary Examiner* — Igwe U Anya
(74) *Attorney, Agent, or Firm* — Oblon, McClelland, Maier & Neustadt, L.L.P.

(57) ABSTRACT

According to one embodiment, a semiconductor device includes first, second, third nitride members, first, second, third electrodes, and a first insulating member. The first nitride member includes a first face along a first plane, a second face along the first plane, and a third face. The third face is connected with the first and second faces between the first and second faces. The third face crosses the first plane. The first face overlaps a part of the first nitride member. The second nitride member includes a first nitride region provided at the first face. The third nitride member includes a first nitride portion provided at the second face. The first electrode includes a first connecting portion. The second electrode includes a second connecting portion. The third electrode includes a first electrode portion. The first insulating member includes a first insulating region.

20 Claims, 8 Drawing Sheets (56) References Cited

U.S. PATENT DOCUMENTS

2019/0280110 A1* 9/2019 Ohki .................. H01L 29/7783
2019/0296138 A1* 9/2019 Hayashi .............. H01L 29/7786

FOREIGN PATENT DOCUMENTS

| JP | 2008-210836 A | 9/2008 |
| JP | 2009-099774 A | 5/2009 |
| JP | 2010-135640 A | 6/2010 |
| JP | 2012-169470 A | 9/2012 |
| JP | 2013-197305 A | 9/2013 |
| JP | 2014-110320 A | 6/2014 |
| JP | 2019-160966 A | 9/2019 |
| JP | 2019-169572 A | 10/2019 |
| JP | 2020-174202 A | 10/2020 |

* cited by examiner

SEMICONDUCTOR DEVICE

CROSS-REFERENCE TO RELATED APPLICATIONS

This application is based upon and claims the benefit of priority from Japanese Patent Application No. 2021-121276, filed on Jul. 26, 2021; the entire contents of which are incorporated herein by reference.

FIELD

Embodiments described herein generally relate to a semiconductor device.

BACKGROUND

For example, in semiconductor devices such as transistors, improvement of characteristics is desired.

DETAILED DESCRIPTION

According to one embodiment, a semiconductor device includes a first nitride member, a second nitride member, a third nitride member, a first electrode, a second electrode, a third electrode, and a first insulating member. The first nitride member includes $Al_{x1}Ga_{1-x1}N$ ($0 \le x1 < 1$). The first nitride member includes a first face along a first plane, a second face along the first plane, and a third face. A position of the first face in a first direction along the first plane is different from a position of the second face in the first direction. A position of the first face in a second direction crossing the first plane is different from a position of the second face in the second direction. The third face is connected with the first face and the second face between the first face and the second face. The third face crosses the first plane. The first face overlaps a part of the first nitride member in the second direction. The second nitride member includes $Al_{x2}Ga_{1-x2}N$ ($x1 < x2 \le 1$). The second nitride member includes a first nitride region provided at the first face. The third nitride member includes $Al_{x3}Ga_{1-x3}N$ ($x1 < x3 \le 1$). The x3 is different from the x2. The third nitride member includes a first nitride portion provided at the second face. The first electrode includes a first connecting portion. The first connecting portion is connected with at least one of the first face and the first nitride region. The second electrode includes a second connecting portion. The second connecting portion is connected with at least one of the second face and the first nitride portion. The third electrode includes a first electrode portion. The first insulating member includes a first insulating region. The first insulating region is provided between the first electrode portion and the third face.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
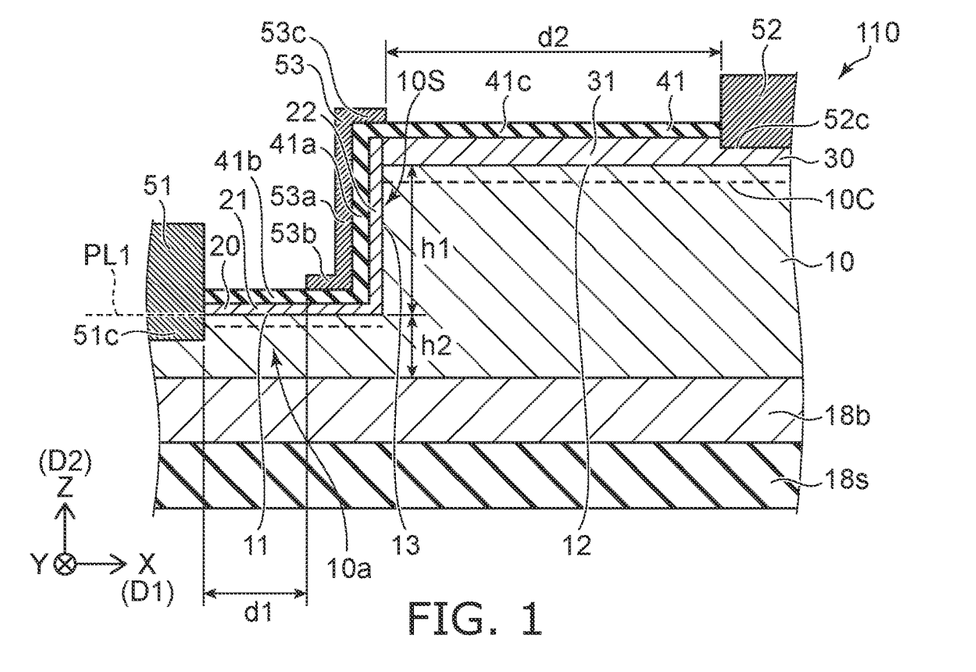
FIG. 1 is a schematic cross-sectional view illustrating a semiconductor device according to the first embodiment.

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first nitride member 10, a second nitride member 20, and a third nitride member 30 and a first insulating member 41.

The first nitride member 10 includes $Al_{x1}Ga_{1-x1}N$ ($0 \le x1 < 1$). The composition ratio x1 may be, for example, not less than 0 and not more than 0.1. The first nitride member 10 is, for example, a GaN layer. The first nitride member 10 includes a first face 11, a second face 12, and a third face 13. The first face 11 is along a first plane PL1. The second face 12 is along the first plane PL1.

One direction along the first plane PL1 is defined as the first direction D1. The first direction D1 is an X-axis direction. The direction perpendicular to the X-axis direction along the first plane PL1 is defined as the Y-axis direction. The direction perpendicular to the X-axis direction and the Y-axis direction is defined as the Z-axis direction. The Z-axis direction is substantially perpendicular to the first plane PL1.

A position of the first face 11 in the first direction D1 along the first plane PL1 is different from a position of the second face 12 in the first direction D1. A position of the first face 11 in the second direction D2 crossing the first plane PL1 is different from a position of the second face 12 in the second direction D2. The second direction D2 is, for example, the Z-axis direction.

The third face 13 is connected with the first face 11 and the second face 12 between the first face 11 and the second face 12. The third face 13 crosses the first plane PL1. The first face 11 overlaps a part of the first nitride member 10 in the second direction D2.

The first face 11 and the second face 12 correspond to, for example, upper surfaces of the first nitride member 10. The first face 11 is below the second face 12. There is a step 10S between the first face 11 and the second face 12. The third face 13 corresponds to a side surface formed between the first face 11 and the second face 12.

The second nitride member 20 includes $Al_{x2}Ga_{1-x2}N$ ($x1<x2\leq1$). The second nitride member 20 includes, for example, AlGaN or AlN. The second nitride member 20 includes a first nitride region 21. The first nitride region 21 is provided at the first face 11. The first nitride region 21 is in contact with, for example, the first face 11.

The third nitride member 30 includes $Al_{x3}Ga_{1-x3}N$ ($x1<x3\leq1$). The third nitride member 30 includes, for example, AlGaN or AlN. The composition ratio x3 is different from the composition ratio x2. The third nitride member 30 includes a first nitride portion 31. The first nitride portion 31 is provided at the second face 12. The first nitride portion 31 is in contact with, for example, the second face 12.

The first electrode 51 includes a first connecting portion 51c. The first connecting portion 51c is connected with at least one of the first face 11 and the first nitride region 21.

The second electrode 52 includes a second connecting portion 52c. The second connecting portion 52c is connected with at least one of the second face 12 and the first nitride portion 31.

The third electrode 53 includes a first electrode portion 53a.

The first insulating member 41 includes a first insulating region 41a. The first insulating region 41a is provided between the first electrode portion 53a and the third face 13.

As shown in FIG. 1, the semiconductor device 110 may include a base body 18s and a nitride layer 18b. The nitride layer 18b is between the base body 18s and the first nitride member 10. The base body 18s may be, for example, a silicon substrate. The nitride layer 18b includes AlGaN and the like. The nitride layer 18b may include, for example, a buffer layer or the like. The nitride layer 18b may include, for example, an undoped GaN layer. The nitride layer 18b is provided on the base body 18s. The first nitride member 10 is provided on the nitride layer 18b. The second nitride member 20 and the third nitride member 30 are provided on the first nitride member 10. The first to third electrodes 51 to 53 are provided on the nitride members. The first nitride member 10, the second nitride member 20, and the third nitride member 30 are, for example, semiconductors.

A current flowing between the first electrode 51 and the second electrode 52 can be controlled by a potential of the third electrode 53. A potential of the third electrode 53 may be, for example, a potential based on a potential of the first electrode 51. The first electrode 51 functions as, for example, one of a source electrode and a drain electrode. The second electrode 52 functions as the other of the source electrode and the drain electrode, for example. The third electrode 53 functions as, for example, a gate electrode. The first insulating region 41a functions as, for example, a gate insulating film. The semiconductor device 110 is, for example, a transistor.

A carrier region 10C is formed in a vicinity of the first face 11 and a vicinity of the second face 12. The carrier region 10C is, for example, a two-dimensional electron gas. The semiconductor device 110 is, for example, HEMT (High Electron Mobility Transistor).

In the embodiment, as described above, the step 10S is provided in the first nitride member 10, and the third electrode 53 is provided at the portion including the step 10S. In this case, the third electrode 53 faces one side surface of the nitride member. On the other hand, there is a reference example in which the first nitride member 10 is provided with a recess. In this reference example, the third electrode 53 faces two steps of the recess. In the reference example, the two steps increase, for example, the ON-resistance.

On the other hand, in the embodiment, the third electrode 53 faces one side surface of the nitride member. Therefore, a lower on-resistance can be obtained as compared with the reference example.

In the embodiment, an Al composition ratio is changed between the second nitride member 20 provided at the first face 11 and the third nitride member 30 provided at the second face 12. Thereby, for example, a gate leak can be suppressed. For example, it is easy to obtain a low ON-resistance.

As shown in FIG. 1, a distance along the first direction D1 between the first connecting portion 51c and the third electrode 53 is defined as the first distance d1. A distance along the first direction D1 between the second connecting portion 52c and the third electrode 53 is defined as the second distance d2. In this case, the first electrode 51 corresponds to the source electrode, and the second electrode 52 corresponds to the drain electrode. For example, a high voltage is applied to the second electrode 52 with reference to the first electrode 51.

In this case, the composition ratio x3 is set lower than the composition ratio x2. For example, the second nitride member 20 includes AlN and the like. The third nitride member 30 includes AlGaN. In this case, the carrier concentration in the region between the third electrode 53 and the second electrode 52 can be lower than the carrier concentration in the region between the third electrode 53 and the first electrode 51. The low carrier concentration in the region between the third electrode 53 and the second electrode 52 suppresses an adverse effect on the third electrode 53. For example, the gate leak current can be suppressed. High gate reliability can be obtained. On the other hand, the carrier concentration in the region between the third electrode 53 and the first electrode 51 is high. This provides a low ON-resistance. According to the embodiment, it is possible to provide a semiconductor device whose characteristics can be improved.

As will be described later, the first distance d1 may be longer than the second distance d2. In this case, the first electrode 51 corresponds to the drain electrode, and the second electrode 52 corresponds to the source electrode. In this case, the composition ratio x3 is set higher than the composition ratio x2. For example, the gate leak current can be suppressed. High gate reliability can be obtained. A low ON-resistance is obtained.

As shown in FIG. 1, the second nitride member 20 may include a second nitride region 22. The second nitride region 22 is provided between the first insulating region 41a and the third face 13. In this way, the second nitride region 22 may be provided at the side surface of the first nitride member 10. It is easy to obtain the second nitride member 20 being more stable.

In this example, the first insulating member 41 includes a second insulating region 41b and a third insulating region 41c. The first nitride region 21 is between the first face 11 and the second insulating region 41b. The first nitride portion 31 is between the second face 12 and the third insulating region 41c.

The third electrode 53 may include a second electrode portion 53b and a third electrode portion 53c. A part of the second insulating region 41b is between a part of the first nitride region 21 and the second electrode portion 53b. The third insulating region 41c is between a part of the second nitride region 22 and the third electrode portion 53c. With such a second electrode portion 53b and a third electrode portion 53c, the first electrode portion 53a can be stably obtained.

As shown in FIG. 1, a distance along the second direction D2 between the position of the first face 11 in the second direction D2 and the position of the second face 12 in the second direction D2 is defined as a distance h1. The distance h1 corresponds to the height (depth) of the step 10S. In the embodiment, the distance h1 is preferably, for example, not less than 100 nm and not more than 400 nm. For example, the side surface (for example, non-polar surface) of the first nitride member 10 can be effectively used. As a result, for example, a high threshold voltage can be easily obtained. For example, it is easy to obtain a normally-off operation.

In such a deep step 10S, the ON-resistance tends to be high. In the embodiment, different composition ratios are provided between the second nitride member 20 and the third nitride member 30 as described above. For example, by setting the composition ratio x2 high, the carrier region 10C with high carrier density can be obtained. As a result, even when a deep step 10S is provided, a low ON-resistance can be obtained.

In the embodiment, the first face 11 and the second face 12 are along, for example, the c-face. For example, each of the angle between the first face 11 and the c-face, and the angle between the second face 12 and the c-face may be not less than 0 degrees and not more than 10 degrees or. As a result, a carrier region 10C having a stable carrier density can be obtained.

As shown in FIG. 1, the nitride layer 18b is provided. The nitride layer 18b may include, for example, a back barrier layer including AlGaN. The nitride layer 18b may include, for example, a superlattice layer or the like. The nitride layer 18b may include, for example, a GaN layer different from that of the first nitride member 10. The nitride layer 18b may include, for example, a Carbon-doped GaN layer.

The first nitride member 10 may include a first partial region 10a. The first partial region 10a is provided between at least a part of the nitride layer 18b and the first nitride region 21. The first partial region 10a is a region that overlaps the first face 11 in the Z-axis direction. The thickness h2 of the first partial region 10a along the second direction D2 is preferably not less than 200 nm and not more than 1000 nm. When the thickness h2 is 200 nm or more, it is easy to suppress the influence of scattering due to impurities and the like from the nitride layer 18b, for example. For example, higher mobility is likely to be obtained. For example, it is easy to obtain a lower ON-resistance.

As shown in FIG. 1, the first face 11 may overlap the first electrode 51 in the first direction D1. For example, the first electrode 51 is embedded in a part of the first nitride member 10. As a result, an electrical connection between the first electrode 51 and a part of the first nitride member 10 can be stably obtained. For example, a low ON-resistance is obtained.

Figure 2:
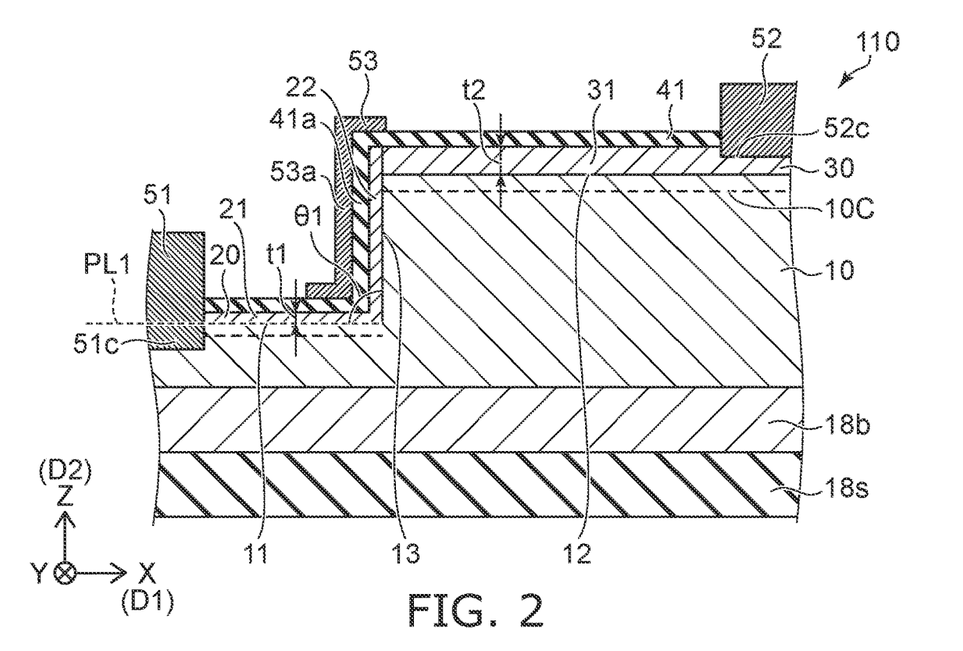
FIG. 2 is a schematic cross-sectional view illustrating the semiconductor device according to the first embodiment.

FIG. 2 is a schematic cross-sectional view illustrating a semiconductor device according to the first embodiment.

As shown in FIG. 2, in a semiconductor device 110, a thickness of the first nitride region 21 along the second direction D2 is defined as a first thickness t1. A thickness of the first nitride portion 31 along the second direction D2 is defined as a second thickness t2. The first thickness t1 is preferably thinner than the second thickness t2. For example, the first nitride region 21 is formed together with the second nitride region 22. The second nitride region 22 is formed in the step 10S. Since the first nitride region 21 and the second nitride region 22 are thin, the second nitride member 20 can be easily formed stably in the region including the step 10S. As described above, when the composition ratio x2 of the first nitride region 21 is higher than the composition ratio x3 of the first nitride portion 31, the first nitride region 21 can be stably obtained by making the first nitride region 21 thin.

For example, the first thickness t1 is preferably not less than 1 nm and not more than 10 nm. When the first thickness t1 is not less than 1 nm, for example, the carrier region 10C with high carrier density can be easily obtained. Easy to obtain low ON-resistance. When the first thickness t1 is not more than 10 nm, for example, a stable crystal can be obtained. It is easy to obtain a crystal with a small leakage current. Gate leak can be reduced.

For example, the second thickness t2 is preferably not less than 20 nm and not more than 40 nm. When the second thickness t2 is not less than 20 nm, for example, the carrier region 10C with high carrier density can be easily obtained. Easy to obtain low ON-resistance. When the second thickness t2 is not more than 40 nm, for example, a stable crystal can be obtained. It is easy to obtain a crystal with a small leakage current. Gate leak can be reduced.

As shown in FIG. 2, an angle between the first face 11 and the third face 13 is defined as an angle θ1. The angle θ1 may be, for example, not less than 70 degrees and not more than 110 degrees. This makes it easy to obtain a high threshold voltage. It is easy to obtain stable normally-off characteristics.

Figure 3:
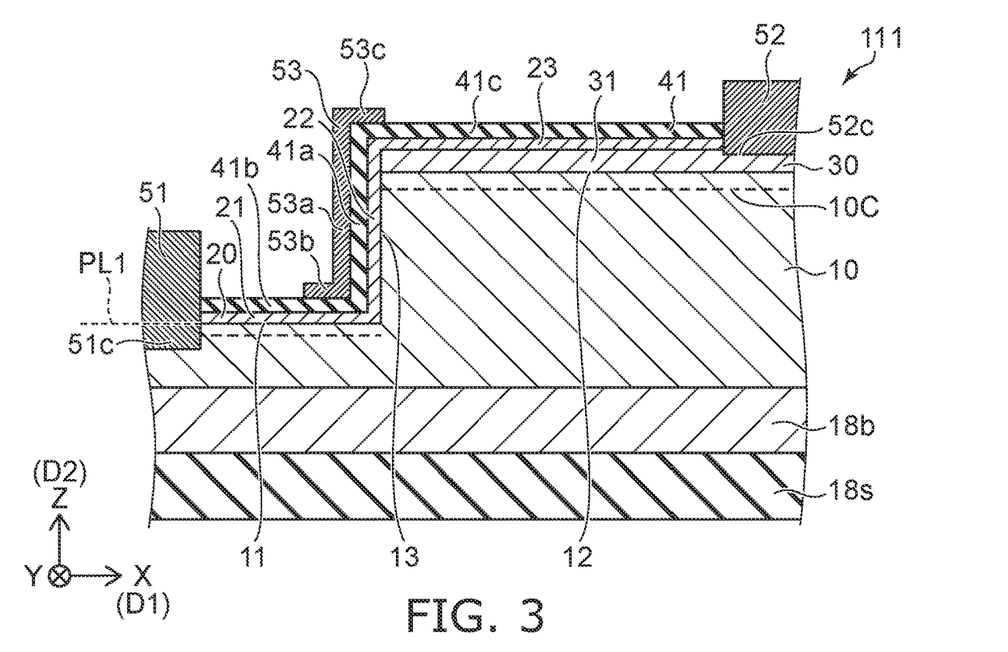
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, in a semiconductor device 111 according to the embodiment, the second nitride member 20 may further include a third nitride region 23. At least a part of the first nitride portion 31 is between the second face 12 and the third nitride region 23. Other configurations of the semiconductor device 111 may be the same as those of the semiconductor device 110. In the semiconductor device 111, the first to third nitride regions 21 to 23 are continuously provided. It is easy to obtain the second nitride member 20 being stable.

Figure 4:
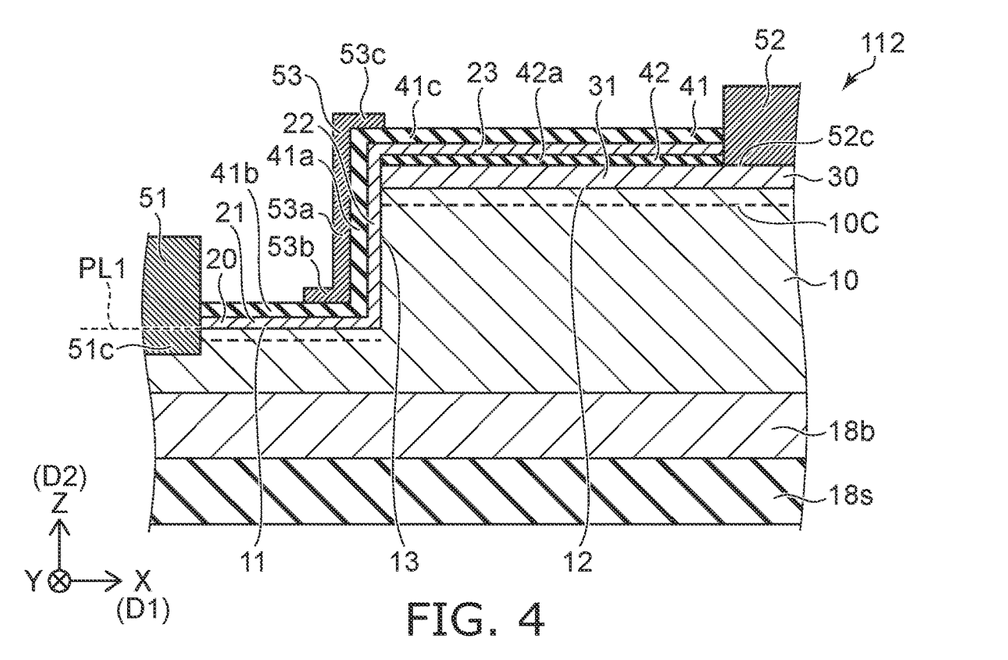
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, a semiconductor device 112 according to the embodiment further includes a second insulating member 42. Other configurations of the semiconductor device 112 may be the same as those of the semiconductor device 111.

The second insulating member 42 includes a first insulating portion 42a. The first nitride portion 31 is between the second face 12 and the first insulating portion 42a. The second insulating member 42 includes, for example, at least one selected from the group consisting of SiN, SiON, $SiO_2$, $AlO_2$, AlON, AlSiO, and AlSiON. The second insulating member 42 may be, for example, a SiN film. The second insulating member 42 functions as, for example, a protective film. By providing the second insulating member 42, for example, the third nitride member 30 being stable can be easily obtained. Current collapse can be suppressed. It is easy to obtain a stable ON-resistance.

As shown in FIG. 4, the second nitride member 20 includes the third nitride region 23. At least a portion of the first nitride portion 31 is between the second face 12 and the third nitride region 23. The first insulating portion 42a is between the first nitride portion 31 and the third nitride region 23. The third nitride region 23 is provided, for example, on the first insulating portion 42a.

For example, at least a part of the second insulating member 42 (first insulating portion 42a) may be amorphous. For example, the adverse effect on the crystal of the first nitride portion 31 can be suppressed.

At least a part of the third nitride region 23 may be amorphous. The crystallinity of the third nitride region 23 may be lower than the crystallinity of the first nitride region 21. Due to the high crystallinity of the first nitride region 21, for example, a high carrier concentration can be easily obtained in a vicinity of the first face 11. Since the crystallinity of the third nitride region 23 is low, it is easy to obtain a low carrier concentration in a vicinity of the second face 12. For example, the leakage current can be effectively suppressed.

In the embodiment, the first insulating member 41 preferably includes at least one selected from the group consisting of $SiO_2$, SiON, AlSiO, $AlO_2$, AlON, $HfO_2$, HfSiO, and HfSiON. It is easy to obtain stable insulation.

Figure 5:
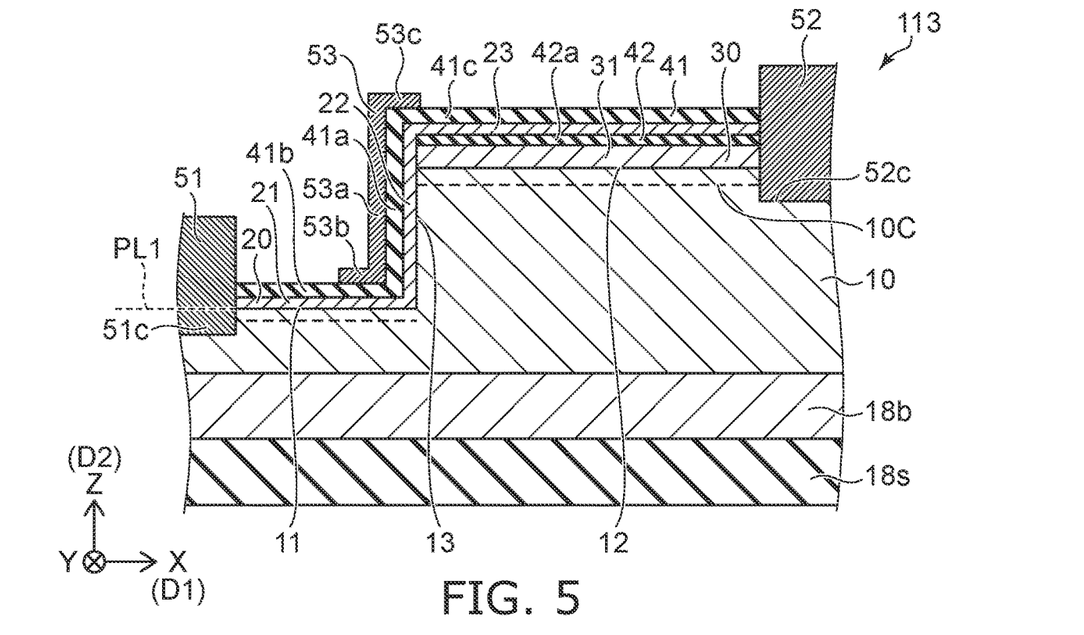
FIG. 5 is a schematic cross-sectional view illustrating a semiconductor device according to the first embodiment.

FIG. 5 is a schematic cross-sectional view illustrating a semiconductor device according to the first embodiment.

As shown in FIG. 5, in a semiconductor device 113 according to the embodiment, the configuration of the second electrode 52 is different from the configuration in the semiconductor device 112. Other configurations of the semiconductor device 113 may be the same as those of the semiconductor device 112.

In the semiconductor device 113, the second face 12 overlaps the second electrode 52 in the first direction D1. For example, the second electrode 52 is embedded in a part of the first nitride member 10. As a result, an electrical connection between the second electrode 52 and a part of the first nitride member 10 can be stably obtained. For example, it is easy to obtain low contact resistance. For example, a low ON-resistance is obtained.

Figure 6:
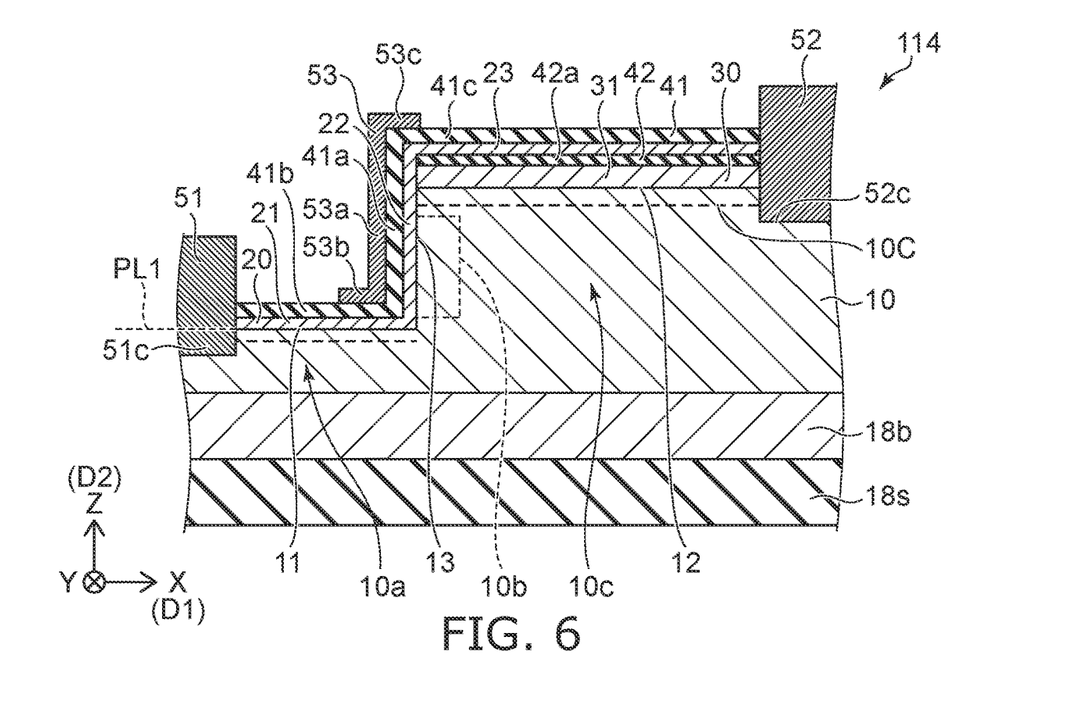
FIG. 6 is a schematic cross-sectional view illustrating a semiconductor device according to the first embodiment.

FIG. 6 is a schematic cross-sectional view illustrating a semiconductor device according to the first embodiment.

As shown in FIG. 6, in a semiconductor device 114 according to the embodiment, the configuration of the first nitride member 10 is different from the configuration in the semiconductor device 113. Other configurations of the semiconductor device 114 may be the same as those of the semiconductor device 113.

As shown in FIG. 6, in this example, the first nitride member 10 includes a second partial region 10b and a third partial region 10c. The second partial region 10b includes at least a part of the third face 13. The second partial region 10b is between the first insulating region 41a and the third partial region 10c in the first direction D1. The second partial region 10b includes a first element. The first element includes at least one selected from the group consisting of Mg, Zn and C. The first element is, for example, a p-type impurity. The third partial region 10c does not include the first element. Alternatively, a concentration of the first element in the third partial region 10c is lower than a concentration of the first element in the second partial region 10b. By providing such a second partial region 10b, for example, a high threshold voltage can be easily obtained. The threshold voltage can be easily adjusted. It is easy to obtain stable normally-off characteristics.

Figure 7:
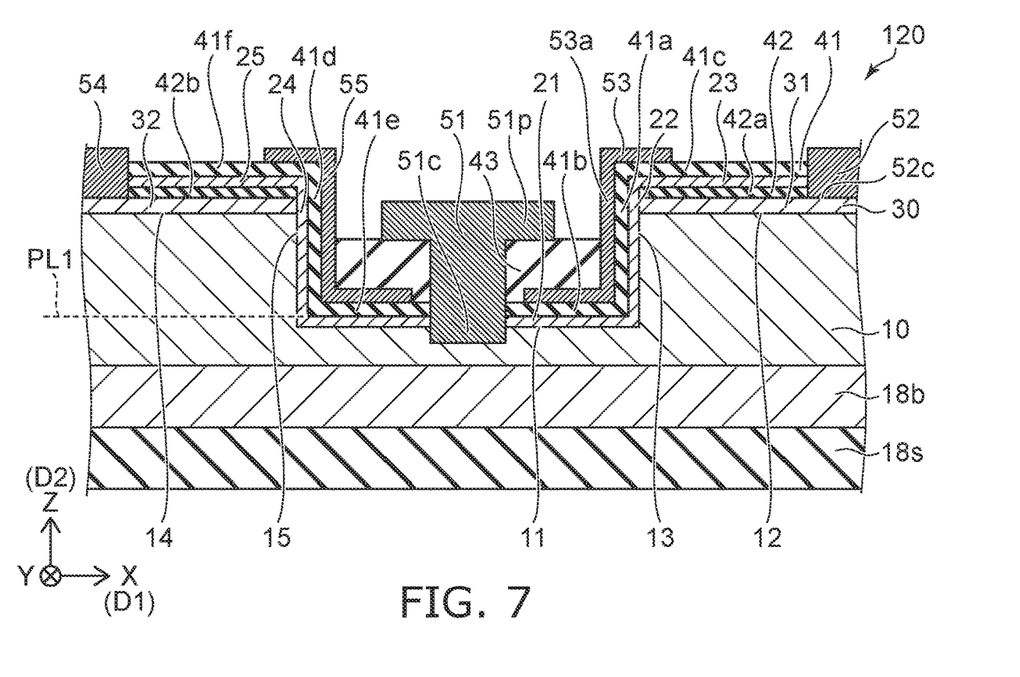
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, in the semiconductor device 120 according to the embodiment, the configuration of the first electrode 51 is different from that in the semiconductor device 112. Other configurations of the semiconductor device 120 may be the same as those of the semiconductor device 112.

In the semiconductor device 120, the first electrode 51 includes a first protruding portion 51p. The first protruding portion 51p is connected with the first connecting portion 51c. A position of at least a part of the first protruding portion 51p in the first direction D1 is between a position of the first connecting portion 51c in the first direction D1 and a position of the second electrode 52 in the first direction D1. The first protruding portion 51p protrudes the second electrode 52.

The first nitride region 21 is between the first face 11 and the first protruding portion 51p in the second direction D2. For example, the semiconductor device 120 may include a third insulating member 43. The third insulating member 43 is between the first nitride region 21 and the first protruding portion 51p.

By providing the first protruding portion 51p, for example, it is easy to obtain a first connecting portion 51c having a stable shape in the first electrode 51. As a result, stable characteristics with less fluctuation due to process variation can be obtained.

As shown in FIG. 7, for example, at least a part of the third electrode 53 may be between the first nitride region 21 and the first protruding portion 51p in the second direction D2. As a result, the distance between the first connecting portion 51c and the third electrode 53 can be easily shortened. For example, the ON-resistance can be reduced. The third insulating member 43 is between at least a part of the third electrode 53 and the first protruding portion 51p. As a result, stable characteristics with less fluctuation due to process variation can be obtained.

As shown in FIG. 7, the semiconductor device 120 may further include a fourth electrode 54 and a fifth electrode 55. The first nitride member 10 includes a fourth face 14 and a fifth face 15. The fourth face 14 is along the first plane PL1. A direction from the fourth face 14 to the second face 12 is along the first direction D1. A position of the first face 11 in the first direction D1 is between a position of the fourth face 14 in the first direction D1 and a position of the second face 12 in the first direction D1.

The fifth face 15 is connected with the fourth face 14 and the first face 11 in a region between the fourth face 14 and the first face 11. The fifth face 15 crosses the first plane PL1.

The third nitride member 30 includes a second nitride portion 32. The second nitride portion 32 is provided on the fourth face 14. The fourth electrode 54 is connected with at least one of the fourth face 14 and the second nitride portion 32. A part of the first insulating member 41 (for example, the fourth insulating region 41d) is between the fifth face 15 and the fifth electrode 55.

The function of the fourth electrode 54 may be the same as that of the second electrode 52, for example. The function of the fifth electrode 55 may be the same as that of the third electrode 53, for example. For example, the first electrode 51, the second electrode 52, and the third electrode 53 function as one transistor. For example, the first electrode 51, the fourth electrode 54, and the fifth electrode 55 function as another transistor. In another one transistor, the configuration of the transistor formed by the first electrode 51, the second electrode 52, and the third electrode 53 may be applied.

For example, the first insulating member 41 may include fourth to sixth insulating regions 41d to 41f. The second insulating member 42 may include the second insulating portion 42b. The second nitride member 20 may include a fourth nitride region 24 and a fifth nitride region 25. The fourth nitride region 24 is provided between the fifth face 15 and the fourth insulating region 41d. The second insulating portion 42b is provided between the second nitride portion 32 and the fifth nitride region 25.

Figure 8:
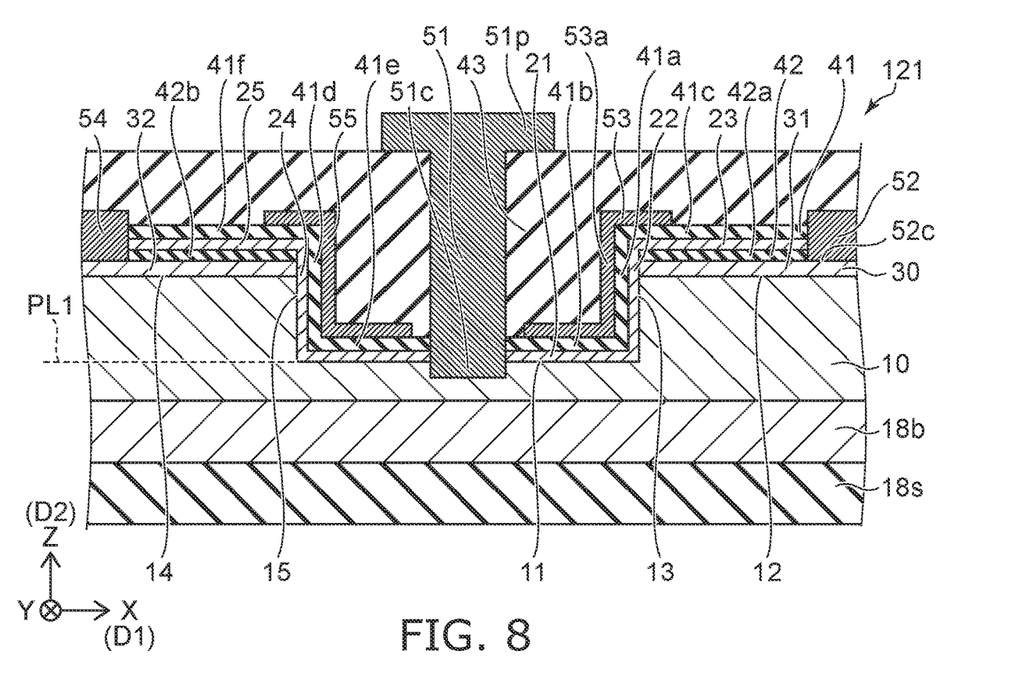
FIG. 8 is a schematic cross-sectional view illustrating a semiconductor device according to the first embodiment.

FIG. 8 is a schematic cross-sectional view illustrating a semiconductor device according to the first embodiment.

As shown in FIG. 8, in a semiconductor device 121 according to the embodiment, the configuration of the first electrode 51 is different from that in the semiconductor device 120. Other configurations of the semiconductor device 121 may be the same as those of the semiconductor device 120.

In the semiconductor device 121, a position of the third electrode 53 in the second direction D2 is between a position of the first nitride region 21 in the second direction D2 and a position of the first protruding portion 51p in the second direction D2. At least a part of the third insulating member 43 is provided between the third electrode 53 and the first protruding portion 51p.

Figure 9:
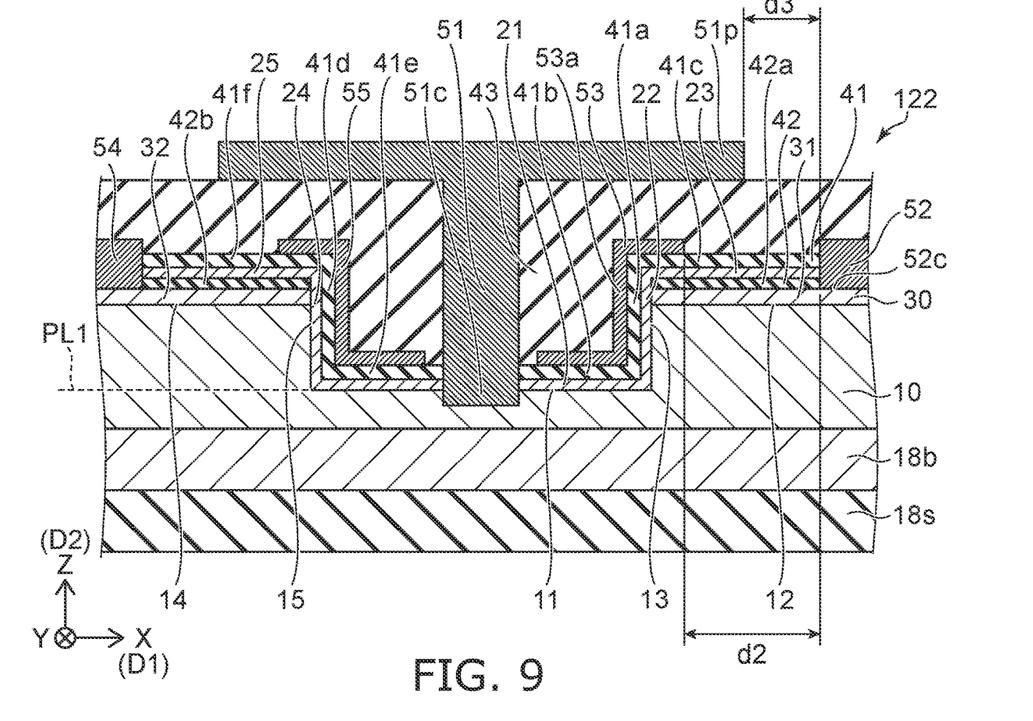
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, in a semiconductor device 122 according to the embodiment, the configuration of the first electrode 51 is different from that in the semiconductor device 121. Other configurations of the semiconductor device 122 may be the same as those of the semiconductor device 121.

In the semiconductor device 122, a distance between the third electrode 53 and the second electrode 52 (for example, the second connecting portion 52c) along the first direction D1 corresponds to the first distance d2. A distance between the first protruding portion 51p and the second electrode 52 along the first direction D1 is defined as a third distance d3. The second distance d2 is longer than the third distance d3. For example, at least a part of the first protruding portion 51p overlaps a region between the third electrode 53 and the second electrode 52 in the second direction D2. The first protruding portion 51p functions as, for example, a field plate. More stable characteristics can be obtained. For example, it is easy to obtain a high breakdown voltage. For example, current collapse can be suppressed. It is easy to obtain a stable ON-resistance.

Second Embodiment

Figure 10:
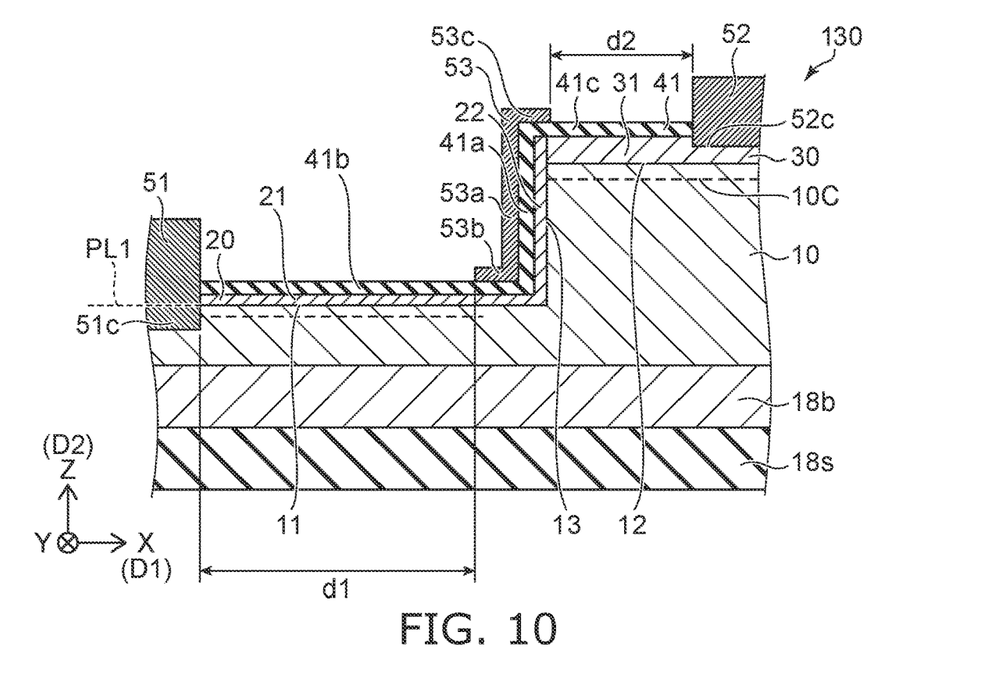
FIG. 10 is a schematic cross-sectional view illustrating a semiconductor device according to the second embodiment.

FIG. 10 is a schematic cross-sectional view illustrating a semiconductor device according to a second embodiment.

As shown in FIG. 10, in a semiconductor device 130 according to the embodiment, a position of the first electrode 51 is different from that in the semiconductor device 110. Other configurations of the semiconductor device 130 may be the same as those of the semiconductor device 110.

As shown in FIG. 10, in the semiconductor device 130, the first distance d1 along the first direction D1 between the first connecting portion 51c and the first electrode portion 53a is longer than the second distance d2 along the first direction D1 between the second connecting portion 52c and the first electrode portion 53a. In this example, for example, the first electrode 51 functions as a drain electrode, and the second electrode 52 functions as a source electrode. In this case, the composition ratio x3 in the third nitride member 30 is higher than the composition ratio x2 in the second nitride member 20. For example, when the composition ratio x2 is low in the first nitride region 21 in the vicinity of the first electrode 51 that functions as a drain electrode, for example, a leak current can be suppressed. For example, when the composition ratio x3 is high in the first nitride portion 31 in the vicinity of the second electrode 52 that functions as the source electrode, for example, a low ON-resistance can be obtained. It is possible to provide a semiconductor device whose characteristics can be improved.

Hereinafter, an example of a method for manufacturing a semiconductor device according to the embodiment will be described.

FIG. 11A to FIG. 11C, FIG. 12A to FIG. 12C, FIG. 13A and FIG. 13B are schematic cross-sectional views illustrating the semiconductor device according to the embodiment.

Figure 11A:
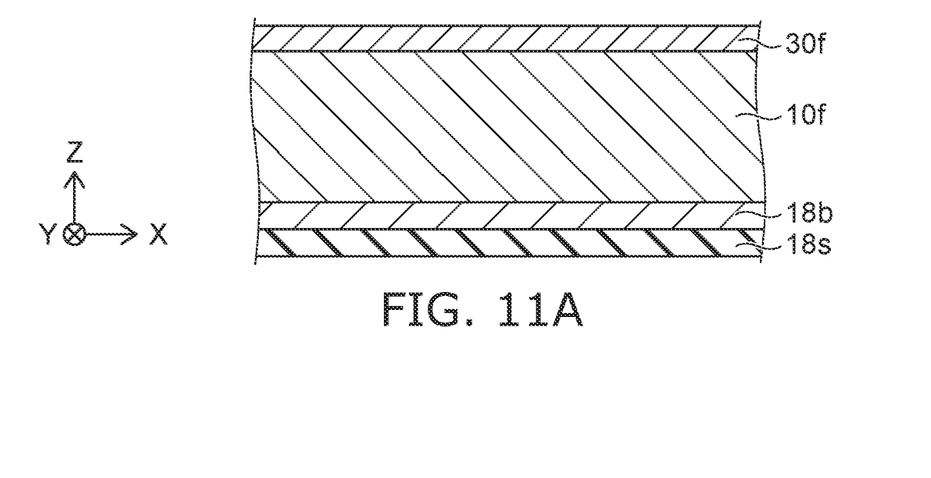
FIG. 11A to FIG. 11C are schematic cross-sectional views illustrating the semiconductor device according to the embodiment.

As shown in FIG. 11A, a nitride film 10f serving as the first nitride member 10 is formed on the nitride layer 18b provided on the base body 18s. A nitride film 30f to be the third nitride member 30 is formed on the nitride film 10f. These nitride films are formed, for example, by epitaxial growth.

Figure 11B:
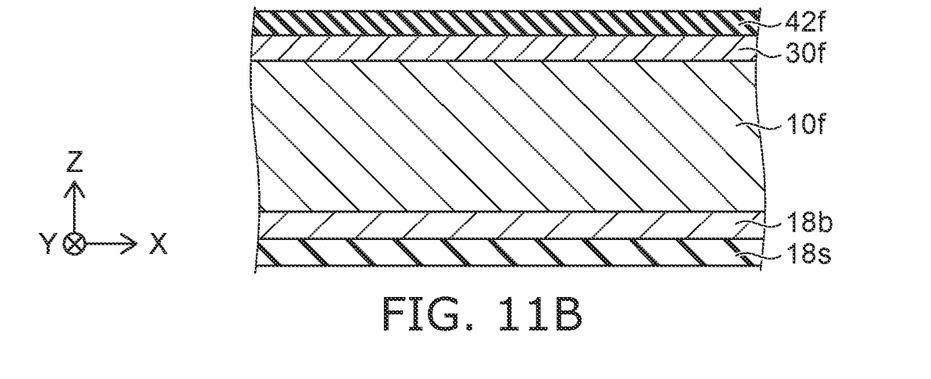

As shown in FIG. 11B, an insulating film 42f serving as the second insulating member 42 is formed on the nitride film 30f.

Figure 11C:
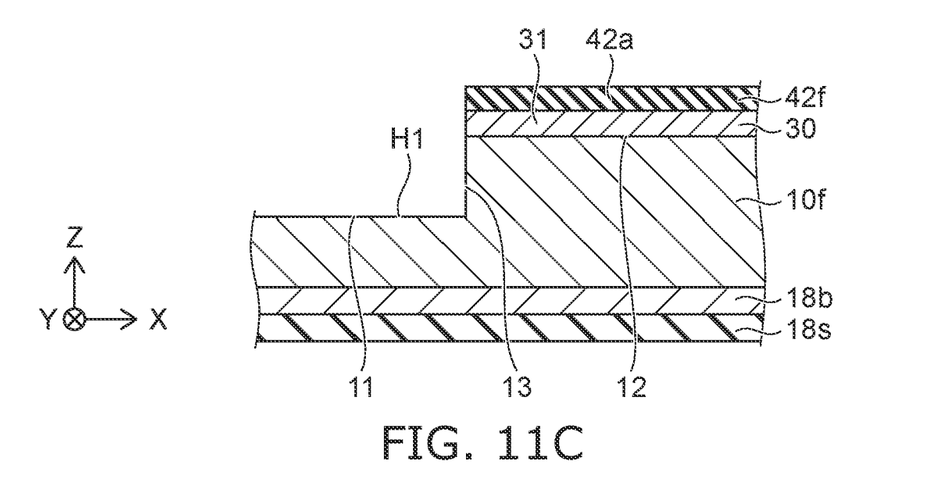

As shown in FIG. 11C, a part of the insulating film 42f, a part of the nitride film 30f, and a part of the nitride film 10f are removed to form a hole H1. For removal, for example, dry etching with a chlorine-based gas is performed. Chemical solution treatment may be performed after etching. Thereby, for example, the shape of the step portion is controlled. For the chemical treatment, for example, an alkaline solution (for example, tetramethylammonium hydroxide) is used. A damage is effectively removed and the shape is properly controlled. Heat treatment may be performed instead of the chemical treatment.

The first nitride portion 31 is formed from the nitride film 30f. The first insulating portion 42a is formed from the insulating film 42f. A part of the surface of the nitride film 10f being exposed becomes the first face 11. The side surface of the hole H1 becomes the third face 13. The surface of the nitride film 10f facing the first nitride portion 31 becomes the second face 12.

Figure 12A:
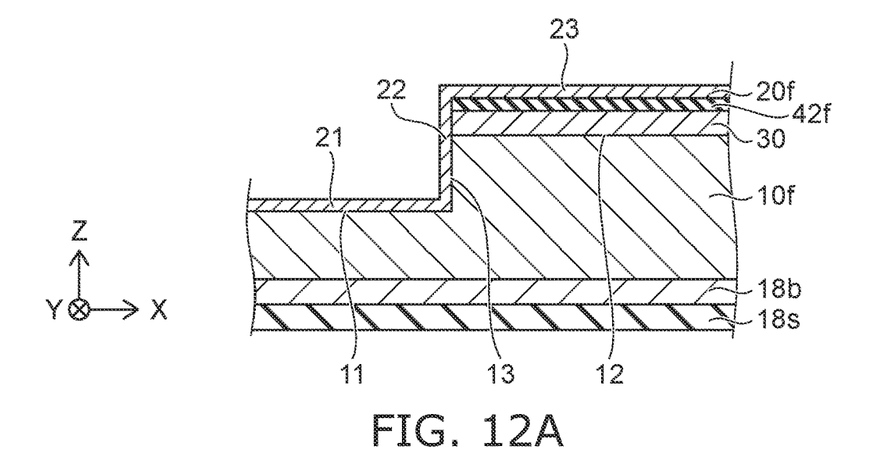
FIG. 12A to FIG. 12C are schematic cross-sectional views illustrating the semiconductor device according to the embodiment.

As shown in FIG. 12A, a nitride film 20f serving as the second nitride member 20 is formed. The first to third nitride regions 21 to 23 are formed.

Figure 12B:
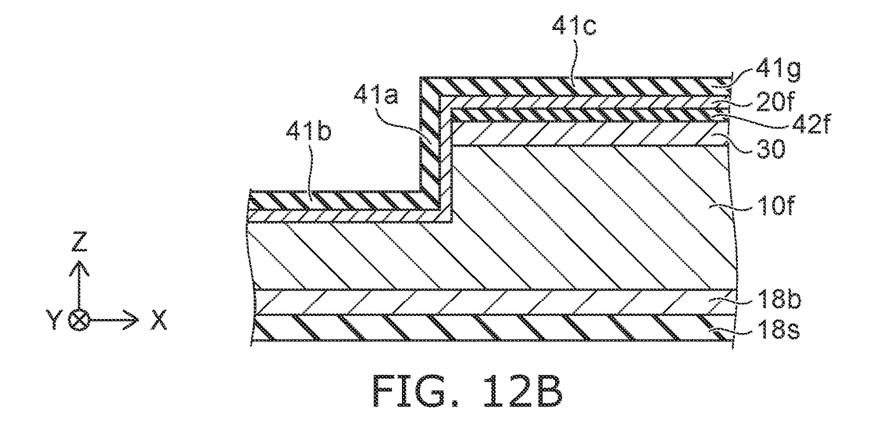

As shown in FIG. 12B, an insulating film 41g serving as the first insulating member 41 is formed. The first to third insulating regions 41a to 41c are formed.

Figure 12C:
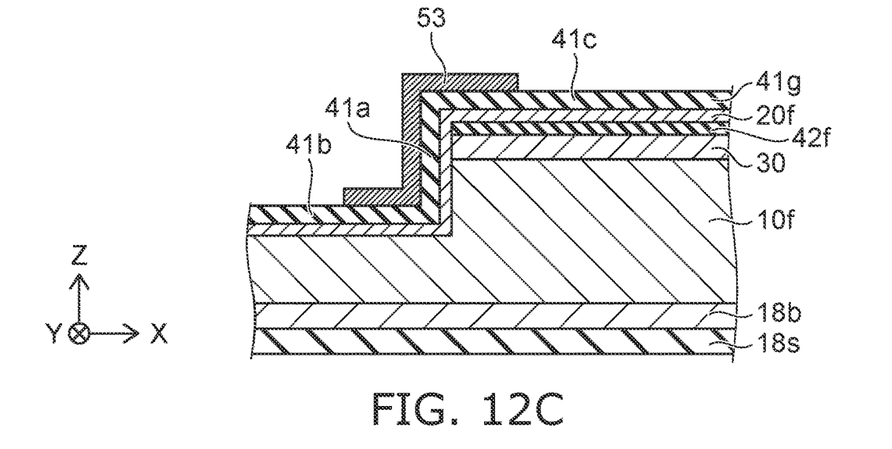

As shown in FIG. 12C, the third electrode 53 is formed.

Figure 13A:
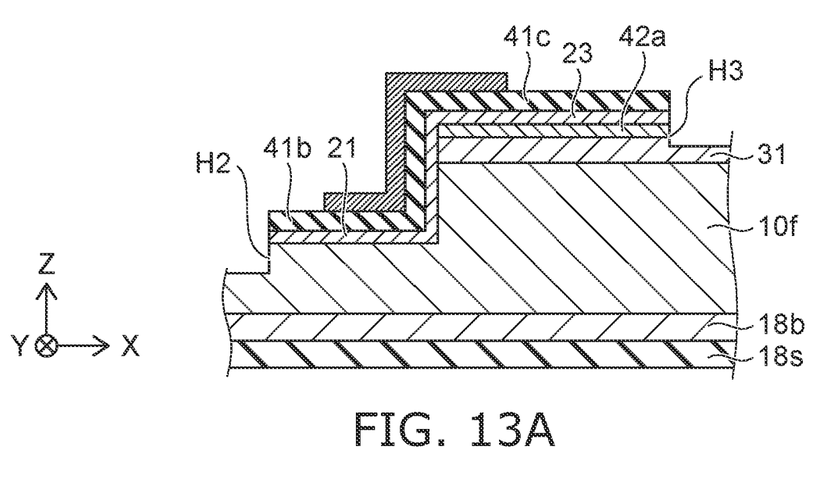
FIG. 13A and FIG. 13B are schematic cross-sectional views illustrating the semiconductor device according to the embodiment.

As shown in FIG. 13A, a part of the second insulating region 41b and a part of the first nitride region 21 are removed to form the hole H2. At this time, a part of the nitride film 10f may be removed. A part of the third insulating region 41c, a part of the third nitride region 23, and a part of the first insulating portion 42a are removed to form a hole H3.

Figure 13B:
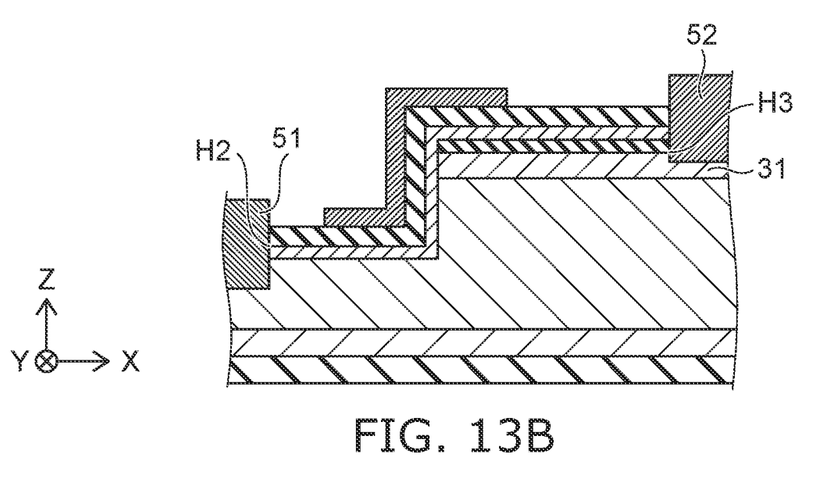

As shown in FIG. 13B, a conductive material is provided in the holes H2 and H3, and the first electrode 51 and the second electrode 52 are formed. Thereby, for example, the semiconductor device 112 is obtained.

According to the manufacturing method according to the embodiment, a semiconductor device whose characteristics can be improved can be obtained. According to the embodiment, a semiconductor device whose characteristics can be improved can be obtained.

The first electrode 51 includes, for example, at least one selected from the group consisting of aluminum, titanium, nickel, and gold. The second electrode 52 and the fourth electrode 54 include, for example, at least one selected from the group consisting of aluminum, titanium, nickel, and gold. The third electrode 53 and the fifth electrode 55 include, for example, at least one selected from the group consisting of TiN, WN, Ni, Au, Pt and Ti. The third electrode 53 and the fifth electrode 55 may include, for example, conductive silicon or polysilicon.

Information on the thickness can be obtained by observing with an electron microscope. Information on the composition can be obtained by SIMS (Secondary Ion Mass Spectrometry) or EDX (Energy dispersive X-ray spectroscopy).

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as nitride members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first nitride member including $Al_{x1}Ga_{1-x1}N$ ($0 \le x < 1$), the first nitride member including a first face along a first plane, a second face along the first plane, and a third face, a position of the first face in a first direction along the first plane being different from a position of the second face in the first direction, a position of the first face in a second direction crossing the first plane being different from a position of the second face in the second direction, the third face being connected with the first face and the second face between the first face and the second face, the third face crossing the first plane, the first face overlapping a part of the first nitride member in the second direction;
a second nitride member including $Al_{x2}Ga_{1-x2}N$ ($x1 < x2 \le 1$), the second nitride member including a first nitride region provided at the first face;
a third nitride member including $Al_{x3}Ga_{1-x3}N$ ($x1 < x3 \le 1$), the x3 being different from the x2, the third nitride member including a first nitride portion provided at the second face;
a first electrode including a first connecting portion, the first connecting portion being connected with at least one of the first face and the first nitride region;
a second electrode including a second connecting portion, the second connecting portion being connected with at least one of the second face and the first nitride portion;
a third electrode including a first electrode portion; and
a first insulating member including a first insulating region, the first insulating region being provided between the first electrode portion and the third face.

2. The device according to claim 1, wherein
a first distance along the first direction between the first connecting portion and the third electrode is shorter than a second distance along the first direction between the second connecting portion and the third electrode, and
the x3 is lower than the x2.

3. The device according to claim 1, wherein
the second nitride member includes a second nitride region, and
the second nitride region is provided between the first insulating region and the third face.

4. The device according to claim 1, wherein a first thickness of the first nitride region along the second direction is thinner than a second thickness of the first nitride portion along the second direction.

5. The device according to claim 4, wherein
the first thickness is not less than 1 nm and not more than 10 nm, and
the second thickness is not less than 20 nm and not more than 40 nm.

6. The device according to claim 1, wherein
a first distance along the first direction between the first connecting portion and the third electrode is longer than a second distance along the first direction between the second connecting portion and the third electrode, the x3 is higher than the x2.

7. The device according to claim 1, wherein
a distance along the second direction between the position of the first face in the second direction and the position of the second face in the second direction is not less than 100 nm and not more than 400 nm.

8. The device according to claim 1, wherein
the second nitride member further includes a third nitride region, and
at least a part of the first nitride portion is between the second face and the third nitride region.

9. The device according to claim 1, further comprising:
a second insulating member including a first insulating portion,
the first nitride portion being between the second face and the first insulating portion.

10. The device according to claim 9, wherein
the second nitride member further includes a third nitride region,
at least a part of the first nitride portion is between the second face and the third nitride region, and
at least a part of the third nitride region is amorphous, or a crystallinity of the third nitride region is lower than a crystallinity of the first nitride region.

11. The device according to claim 9, wherein at least a part of the first insulating portion is amorphous.

12. The device according to claim 9, wherein the second insulating member includes at least one selected from the group consisting of SiN, SiON, $SiO_2$, $AlO_2$, AlON, AlSiO, and AlSiON.

13. The device according to claim 1, wherein the second face overlaps the second electrode in the first direction.

14. The device according to claim 1, wherein the first face overlaps the first electrode in the first direction.

15. The device according to claim 1, wherein
the first nitride member includes a second partial region and a third partial region,
the second partial region includes at least a part of the third face,
the second partial region is between the first insulating region and the third partial region in the first direction,
the second partial region includes a first element,
the first element includes at least one selected from the group consisting of Mg, Zn and C, and
the third partial region does not include the first element, or a concentration of the first element in the third partial region is lower than a concentration of the first element in the second partial region.

16. The device according to claim 1, further comprising:
a nitride layer,
the first nitride member including a first partial region,
the first partial region being between the first nitride region and at least a part of the nitride layer, and
a thickness of the first partial region along the second direction being not less than 200 nm and not more than 1000 nm.

17. The device according to claim 1, wherein
the first electrode further includes a first protruding portion connected with the first connecting portion,
the first nitride region is between the first face and the first protruding portion in the second direction, and
at least a part of the third electrode is between the first nitride region and the first protruding portion in the second direction.

18. The device according to claim 17, wherein a position of the third electrode in the second direction is between a position of the first nitride region in the second direction and a position of the first protruding portion in the second direction.

19. The device according to claim 18, wherein a distance between the third electrode and the second electrode along the first direction is longer than a distance between the first protruding portion and the second electrode along the first direction.

20. The device according to claim 1, further comprising:
a fourth electrode; and
a fifth electrode,
the first nitride member further including a fourth face along the first plane, and a fifth face along the first plane,
a direction from the fourth face to the second face being along the first direction,
a position of the first face in the first direction being between a position of the fourth face in the first direction and a position of the second face in the first direction,
the fifth face being connected with the fourth face and the first face between the fourth face and the first face, the fifth face crossing the first plane,
the third nitride member further including a second nitride portion provided at the fourth face,
the fourth electrode being connected with at least one of the fourth face and the second nitride portion, and
a part of the first insulating member being between the fifth face and the fifth electrode.

* * * * *